(12) United States Patent
Gerfast

(10) Patent No.: US 10,333,235 B1
(45) Date of Patent: Jun. 25, 2019

(54) SELECTING SWITCHING FUNCTIONS USING SCREW-FORCE, ON MODULES HAVING TRACES

(71) Applicant: Sten R. Gerfast, Mendota Heights, MN (US)

(72) Inventor: Sten R. Gerfast, Mendota Heights, MN (US)

( * ) Notice: Subject to any disclaimer, the term of this patent is extended or adjusted under 35 U.S.C. 154(b) by 0 days.

(21) Appl. No.: 15/932,563

(22) Filed: Mar. 15, 2018

(51) Int. Cl.
*H01R 9/18* (2006.01)
*H01R 12/70* (2011.01)
*H05K 1/18* (2006.01)
*H01L 21/48* (2006.01)

(52) U.S. Cl.
CPC ............ *H01R 9/18* (2013.01); *H01L 21/4814* (2013.01); *H01R 12/70* (2013.01); *H05K 1/18* (2013.01); *H05K 2201/10287* (2013.01)

(58) Field of Classification Search
CPC ....... H01R 9/18; H01R 21/4814; H01R 12/70
USPC .......................................................... 439/737
See application file for complete search history.

(56) References Cited

U.S. PATENT DOCUMENTS

| | | | | | |
|---|---|---|---|---|---|
| 2,991,440 | A | * | 7/1961 | Kulka | H01R 12/58 174/267 |
| 3,880,486 | A | * | 4/1975 | Avakian | H05K 3/308 174/262 |
| 4,548,450 | A | * | 10/1985 | Reimer | H01R 12/585 439/556 |
| 4,707,039 | A | * | 11/1987 | Whipple | H01R 23/6873 439/581 |
| 4,758,927 | A | * | 7/1988 | Berg | H05K 3/325 29/827 |
| 4,873,763 | A | * | 10/1989 | Volonta | H01R 4/64 29/825 |
| 5,017,164 | A | * | 5/1991 | Gibbs | H01R 12/57 439/83 |
| 5,041,026 | A | * | 8/1991 | Hansel | H01H 1/5855 411/302 |
| 5,254,016 | A | * | 10/1993 | Ganthier | H01R 12/714 411/339 |
| 5,494,462 | A | * | 2/1996 | Auclair | H01R 4/36 411/300 |
| 5,656,798 | A | * | 8/1997 | Kubo | H01L 21/486 174/263 |
| 5,920,456 | A | * | 7/1999 | Bozzone | H02B 1/16 174/59 |
| 6,024,589 | A | * | 2/2000 | Hahn, IV | H05K 1/148 174/71 B |

(Continued)

*Primary Examiner* — Alexander Gilman

(57) ABSTRACT

This invention can be used as mini-micro-switching, up to macro switching.
An electronic module having several input copper circuit traces, and several output copper traces, or wires, with some traces having disconnects, consisting of drilled holes, which can be bridged by conductive fasteners.
This invention is also solving switching of differing functions both in the industry, and after that the product is in the market and the customer requests switching options. Selecting a switching options can be accomplished on a module, by first remove a conductive fastener from one position and attach the fastener in a second position on copper traces. Where the fastener is removed and not re-inserted, an open circuit trace occurs. Thereby accomplishing:
selecting, reversing, or switching of one, or of a multiple of circuits.

6 Claims, 2 Drawing Sheets

(56) References Cited

U.S. PATENT DOCUMENTS

| | | | | |
|---|---|---|---|---|
| 6,050,844 A * | 4/2000 | Johnson | ................... | H01R 4/22 |
| | | | | 439/415 |
| 6,175,509 B1 * | 1/2001 | Koch | ..................... | H05K 1/141 |
| | | | | 174/260 |
| 6,302,709 B1 * | 10/2001 | Ross | ........................ | H01R 4/34 |
| | | | | 439/78 |
| 6,349,466 B1 * | 2/2002 | Redler | ................... | H01R 4/302 |
| | | | | 29/825 |
| 6,629,854 B2 * | 10/2003 | Murakami | ............... | H02B 1/20 |
| | | | | 439/212 |
| 6,663,443 B1 * | 12/2003 | Smith | ...................... | H01R 4/36 |
| | | | | 439/810 |
| 7,029,336 B2 * | 4/2006 | Cox | ......................... | H01R 4/38 |
| | | | | 439/709 |
| 7,121,840 B1 * | 10/2006 | Coon | ................... | G11B 15/689 |
| | | | | 439/67 |
| 7,269,896 B2 * | 9/2007 | Edwardsen | .......... | H01R 43/205 |
| | | | | 29/33 M |
| 7,347,739 B2 * | 3/2008 | Cox | ......................... | H01R 4/38 |
| | | | | 439/709 |
| 8,480,419 B2 * | 7/2013 | Holbrook | ................ | B60R 25/00 |
| | | | | 174/72 B |
| 9,185,791 B2 * | 11/2015 | Wang | ................... | H05K 1/0204 |
| D776,615 S * | 1/2017 | Manhart | ....................... | D13/121 |
| 9,553,397 B2 * | 1/2017 | Eom | .................. | H01R 13/5205 |
| 9,825,378 B2 * | 11/2017 | Konig | .................... | H01R 4/183 |
| 9,853,383 B2 * | 12/2017 | Hricik | .................... | H01R 13/03 |
| 9,900,978 B2 * | 2/2018 | Su | .......................... | H05K 3/429 |
| 9,905,954 B2 * | 2/2018 | Chan | ................... | H01R 12/718 |

\* cited by examiner

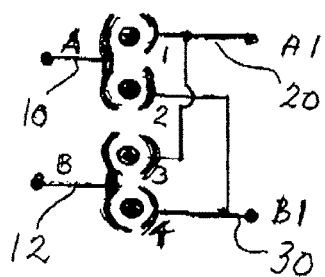
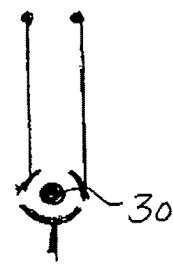
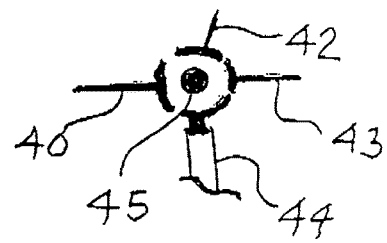
FIG. 1  FIG. 2  FIG. 3
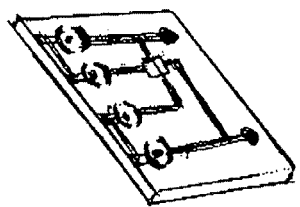
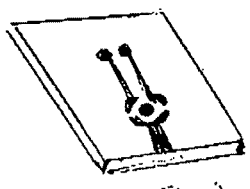
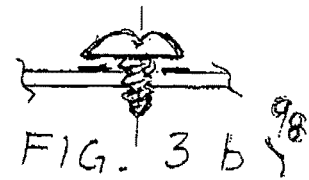
FIG. 1b  FIG. 2b  FIG. 3b
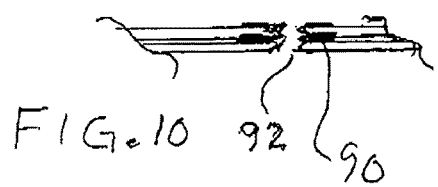
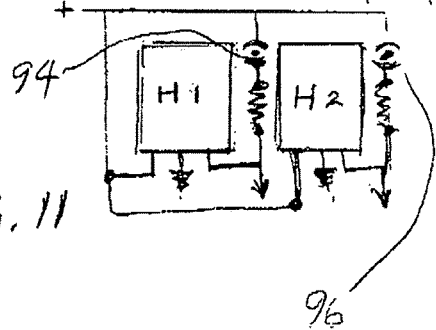
FIG. 10  FIG. 11
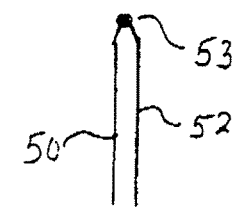
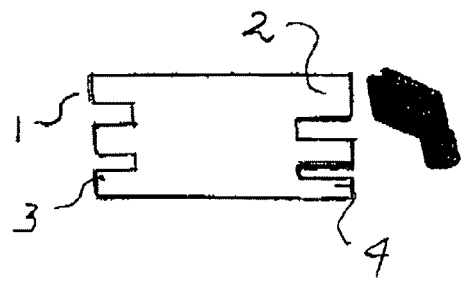
FIG. 4  FIG. 5

SELECTING SWITCHING FUNCTIONS USING SCREW-FORCE, ON MODULES HAVING TRACES

BACKGROUND OF THE INVENTION

This invention is using a screw-type force to close the switch contacts.

It its "Selecting switching functions, using a screw-type force" on a module, and can be used as mini-micro-switching, up to macro switching.

The screw-type force, that press the contacts together, are also self-locking.

The screw-type force, that press the contacts together, have no contact bounce.

Mechanical-engineering books describes "screw-force" as:

Work in=work out multiplied by the pitch angle of the screw thread.

This multiplication factor can be substantial, thereby increasing the switch contact pressure, for a very low ohmic value between the contacts.

Therefore, this invention is approaching a switch functions differently, then other switches that are now in use, which mostly, are using spring-force, or dual sliders in slide switches having spring-force, over-center spring-force, or snap-action-force, to keep the switch contacts together.

It is solving switching of differing functions both in the industry, and after that the product is in the market and the customer requests switching options. Selecting a switching option in industry, is the least expensive, using a "selected action" for this type of switching action. This can be accomplished on a module, by first remove a conductive fastener from one position and attach the fastener in a second position on copper traces.

This could be done on the assembly line, with non-technical persons.

This could also be done by a customer that bought the product.

This could be referred to as "REMOVE AND ATTACH".

It has a definite advantage in that the finished product can have openings in the case to do the "REMOVE AND ATTACH", without opening the case, thereby making it having two versions: changing after assembly, and the customer changing it, as a do-it-your-self option.

This eliminates the necessity of having the same devise, "inventoried" in two versions, for example, having a motor for 120 volts, and the same motor for 240 volts.

This also gives sales the advantage of having two "customer changeable" options. Of course, some of the above described switching, could be done by commercial switches at a higher cost. The above described screw-force switching is using components that are very inexpensive On any product, a cost saving of any one small component, adds to the total cost, which is directly related to what the product can be manufactured for.

If an expensive part can be replaced by two less expensive parts, doing the same unction, a definite advantage occurs.

Therefore, the cost of the individual small component, even a small part, makes for an increased overall cost of the product.

If the product needs to be selected to have two or more functions by a switch, for example: two speeds, and if a switch can be replaced by a simpler module, this simpler arrangement is worth pursuing.

This above description can be expanded into many different switch-circuits by a person skilled in the art.

DESCRIPTIVE SHOWING OF THE DRAWINGS

FIG. 1 is a reversal switch function that can be applied in many circuits, with a 3D version shown in FIG. 1 *b* of the same circuit, having the same numbers.

FIG. 2 is a reversal switch function that can be applied in many circuits, with a 3D version shown in FIG. 2 *b* of the same circuit, having the same numbers.

FIG. 2 is showing macro-switching, one trace into 2, or two into one.

FIG. 3 is a circuit with 4 connections.

FIG. 3 is a switch function that can be applied in many circuits, with a 3D version shown in FIG. 3 *b* of a screw, in a screw thread in an insulating board.

A right turn on the screw switches the circuit on by touching the conductive layer. If the screw is left-hand-thread, a left turn switches the circuit on.

FIG. 4 is showing is mini-micro switching with low current signal type switching.

FIG. 5 is showing how a module can be connected to high current.

Figure 6:
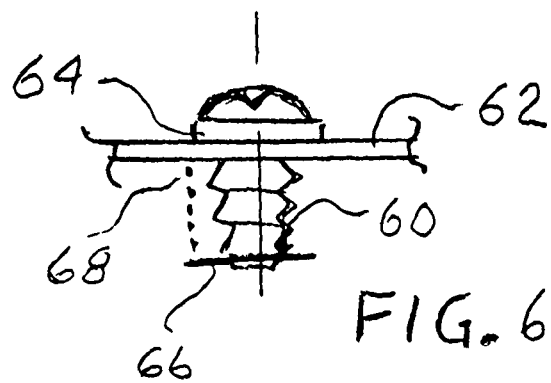

FIG. 6 is showing how a screw is assembled into to a module.

Figures 7, 8:
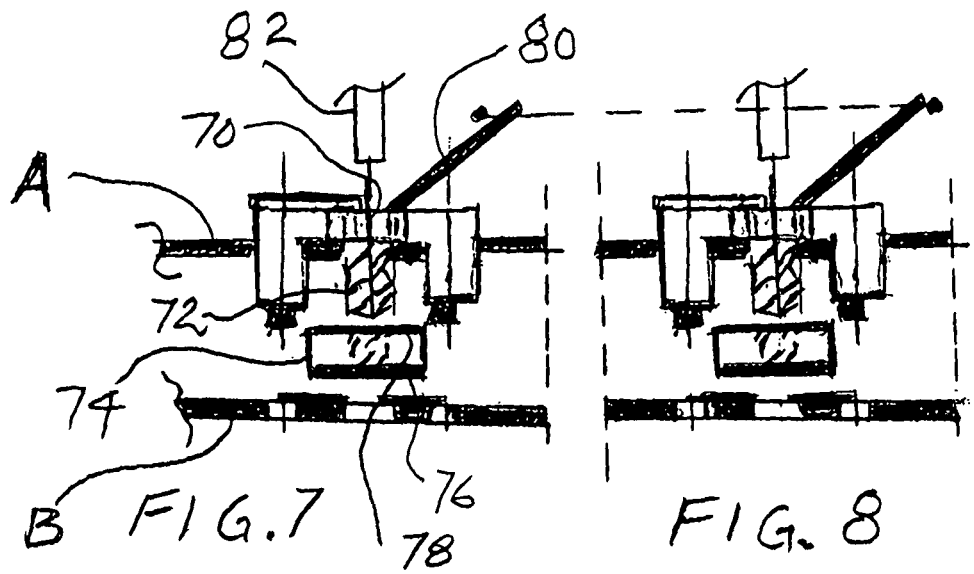

FIG. 7 is an exploded view of a single module assembly, with details.

FIG. 8 is dual modules that are ganged together with FIG. 7.

Figure 9:

FIG. 9 is showing multiple tooth-washers, which can be fixed or assembled under the head of a screw for better connections.

FIG. 10 is showing conductive multi-layers and a threaded hole for insertion of a switch-screw.

FIG. 11 is showing 2 magnetic Hall sensors and how they are switched individually.

DETAILED DESCRIPTION OF THE DRAWING

FIG. 1 is a reversal switch function that can be applied in many circuits. Two inputs 10 and 12, marked A and B, and two outputs 20 and 30, marked A 1 and B 1 are connected to the module. When a screw is assembled in hole 1 and 4 no reversal takes place, but when a screw is assembled in 2 and reversal of the output A 1 and B 1 takes place.

FIG. 1 *b* is a 3 D view of the same circuit as in FIG. 1. It is showing an insulator having conductive traces with the same numbers as in FIG. 1.

FIG. 2 is showing macro-switching, one trace into 2, or two into one.

The center of the screw is shown at 30.

In FIG. 2 *b* is a 3 D view of the same circuit as in FIG. 2. It is showing an insulator having conductive traces with the same numbers in FIG. 2.

FIG. 3 is a circuit with 4 connections. Trace 40, 42 and 43 together with a wire which is shown at 44. The center of the screw is shown at 45.

In FIG. 3 *b* is a 3 D view of a screw shown in non-contacting mode, which could close the circuit, as shown in FIG. 3.

Shown in FIG. 3 *b* is a screw, and a screw thread, in an insulating board.

A right turn on the screw switches the circuit on by touching the conductive layer.

If the screw is left-hand-thread, a left turn switches the circuit on.

FIG. 4 is showing is mini-micro switching with low current signal type switching.

Two miniature traces 50 and 51 are connected at point 53 with a miniature screw.

FIG. 5 is showing how a module that can be connected to high current.

The module can have tabs 1, 2, 3 and 4. Tab number 2 is suitable for a commercial ¼" connector-tab (shown) suitable for high current or number 14 AWG (American wire gauge) if the module is provided with conductive coatings suitable for this current.

FIG. 6 is showing how a screw 60 is assembled into to a module 62, having a conductive washer 64 under the screw-head 60. The screw can be provided with a captured 66 spring 68.

FIG. 7 is an exploded view of a single module assembly, with details.

A screw 70 with a coarse thread 72 is moving an insulating washer 74 with conductive coatings 76 and 78 on top and bottom, to contact either module A or module B. An arm 80 on the screw-head 70 is actuating the screw. It can also be moved with an Allen type screw-driver 82.

FIG. 8 are dual modules that are ganged together with FIG. 7. All the numbers on FIG. 8 are the same as FIG. 7.

FIG. 9 is showing multiple tooth-washers, which can be fixed or assembled under the head of a screw, and are having suitable, different diameters.

FIG. 10 is showing conductive multi-layers 90 and a threaded hole 92 for insertion of a switch-screw, not shown.

FIG. 11 is showing 2 magnetic Hall sensors H 1 and H 2 switched individually.

If H 1 is to actuated a screw is inserted at 94. If H 2 is to be actuated a screw is inserted at 96. If the Halls sensors are enclosed, an opening in the enclosure with holes 98 for actuation by a tool, can provide a chance to do actuation of right or left hall sensor even after final assembly of the device, that contain the Hall sensors.

Again, it important to note that the above descriptions, can be expanded into many different switch-circuits, by a person skilled in the art.

The invention claimed is:

1. An electronic module having at least two input traces bridged by plastic screws with a metal washer affixed, but rotatable, under the screw head, and having an arm attached to the screw-head, wherein the angular rotation of the arm showing if the metal washer is touching the trace, or not, with this "screw switch" serving as a "Sten single pole-single throw" screw switch.

2. An electronic module according to claim 1 having at least two input traces, wherein, when a spring is placed, and secured, in the plastic screw's thread area, thereby urging the screw-head and metal washer to engage the traces for better contact, and additionally, to retain its arm into a specific angular position.

3. An electronic module according to claim 1 having at least two input traces and two output traces, wherein the arm is non-conductive and two of the arms are reachable through an opening in a device, to achieve: two separate on-off functions, reversal function, series/parallel function, or motor functions.

4. An electronic module according to claim 1
   wherein the two non-conductive arms are connected, ganged together, and are reachable through an opening in a device to achieve: two on-off functions, two reversal functions, series/parallel function, or motor functions.

5. An electronic module having brushless motor circuitry, according to claim 1, wherein the motors rotations are determined by flipping a small slide switch in an accessible opening in the motor, to select the appropriate Hall sensor leads.

6. An electronic module having brushless motor circuitry, with several input and output copper circuit traces, having drilled holes, which can be bridged by conductive fasteners, on a selective basis, wherein, when a conductive fastener is inserted in a right hole, or a left hole, in the circuitry, thereby actuating either a right magnetic Hall sensor, or left Hall sensor, either selected as described above, or by a motor customer's insertion of a conductive screw in the correct position, in an accessible motor opening, for achieving clockwise or counter clockwise motor rotation.

* * * * *